(12) United States Patent
An et al.

(10) Patent No.: US 11,127,888 B2
(45) Date of Patent: Sep. 21, 2021

(54) ULTRA-HIGH COLOR RENDERING WHITE LIGHT-EMITTING DEVICE WITH CONTROLLED EMISSION SPECTRUM AND LIGHTING DEVICE CONTAINING THE SAME

(71) Applicants: ALLIX CO., LTD., Jeollabuk-do (KR); Jong Uk An, Jeollabuk-do (KR)

(72) Inventors: Jong Uk An, Jeollabuk-do (KR); Jeong Bin Bae, Jeollabuk-do (KR); Jai Gon Shim, Gwangju (KR)

(73) Assignees: ALLIX CO., LTD., Jeollabuk-do (KR); Jong Uk An, Jeollabuk-do (KR)

(*) Notice: Subject to any disclaimer, the term of this patent is extended or adjusted under 35 U.S.C. 154(b) by 242 days.

(21) Appl. No.: 16/098,224

(22) PCT Filed: Jun. 1, 2018

(86) PCT No.: PCT/KR2018/006296
§ 371 (c)(1),
(2) Date: Nov. 1, 2018

(87) PCT Pub. No.: WO2019/182194
PCT Pub. Date: Sep. 26, 2019

(65) Prior Publication Data
US 2020/0357962 A1 Nov. 12, 2020

(30) Foreign Application Priority Data
Mar. 21, 2018 (KR) .......................... 10-2018-0032625

(51) Int. Cl.
| | | |
|---|---|---|
| H01L 29/18 | (2006.01) | |
| H01L 33/00 | (2010.01) | |
| H01L 33/50 | (2010.01) | |
| H01L 25/075 | (2006.01) | |
| H01L 33/32 | (2010.01) | |
| H01L 33/56 | (2010.01) | |

(52) U.S. Cl.
CPC ........ H01L 33/507 (2013.01); H01L 33/0004 (2013.01); H01L 33/504 (2013.01); H01L 25/075 (2013.01); H01L 33/32 (2013.01); H01L 33/56 (2013.01)

(58) Field of Classification Search
CPC . H01L 33/507; H01L 33/0004; H01L 33/504; H01L 33/32; H01L 33/56; H01L 25/075; H01L 33/50–508; H01L 2933/0041; H01L 51/0084–0092; H01L 51/5016; H01L 2251/5376; F21K 9/64

USPC ........................................................... 257/88
See application file for complete search history.

(56) References Cited

U.S. PATENT DOCUMENTS

| | | | | |
|---|---|---|---|---|
| 2012/0187824 | A1* | 7/2012 | Yamakawa | C09K 11/7734 313/503 |
| 2014/0209934 | A1* | 7/2014 | Cheng | H01L 25/0753 257/88 |
| 2017/0345976 | A1* | 11/2017 | Asai | C09K 11/7739 |

FOREIGN PATENT DOCUMENTS

| | | |
|---|---|---|
| JP | 2011-040724 | 2/2011 |
| JP | 2012-056970 | 3/2012 |
| JP | 2012-195420 | 10/2012 |
| JP | 2017-216438 | 12/2017 |
| KR | 10-2011-0085206 | 7/2011 |
| KR | 10-2015-0143916 | 12/2015 |
| KR | 10-2016-0067312 | 6/2016 |
| KR | 10-2017-0068728 | 6/2017 |
| KR | 10-2017-0112164 | 10/2017 |
| KR | 10-2017-0134241 | 12/2017 |
| WO | WO 2011-033910 | 3/2011 |
| WO | WO 2011-111334 | 9/2011 |
| WO | WO 2013-069435 | 5/2013 |

OTHER PUBLICATIONS

International Search Report dated Mar. 6, 2019 for PCT/KR2018/006296.
Notice of Allowance dated Sep. 11, 2019 corresponding to Korean Patent Application No. 10-2018-0032625, 2 pages.
Notice of Allowance dated Mar. 9, 2021 corresponding to Japanese Patent Application No. 2018-558135, 1 page.

* cited by examiner

*Primary Examiner* — Calvin Y Choi

(57) ABSTRACT

The present disclosure provides an ultra-high color rendering white light-emitting device including a semiconductor LED chip that emits a violet wavelength range of light with an emission peak at 380 nm to 430 nm, and a phosphor layer distributed in a transparent resin layer that emits light when excited by an excitation wavelength of the violet LED chip, wherein the phosphor layer includes a first phosphor having an emission peak at 450-470 nm, a second phosphor having an emission peak at 510-550 nm, a third phosphor having an emission peak at 550-590 nm, a fourth phosphor having an emission peak at 630-660 nm, and a fifth phosphor having an emission peak at 660-730 nm, and the ultra-high color rendering white light-emitting device has Ra that is equal to or higher than 98 and less than 100.

8 Claims, 3 Drawing Sheets

ULTRA-HIGH COLOR RENDERING WHITE LIGHT-EMITTING DEVICE WITH CONTROLLED EMISSION SPECTRUM AND LIGHTING DEVICE CONTAINING THE SAME

This application claims the priority of Korean Patent Application No. 10-2018-0032625, filed on Mar. 21, 2018 in the KIPO (Korean Intellectual Property Office), the disclosure of which is incorporated herein entirely by reference. Further, this application is the National Stage application of International Application No. PCT/KR2018/006296, filed Jun. 1, 2017, which designates the United States and was published in Korean. Each of these applications is hereby incorporated by reference in their entirety into the present application.

TECHNICAL FIELD

The present disclosure relates to an ultra-high color rendering white light-emitting device with controlled emission spectrum and a lighting device containing the same, and more particularly, to an ultra-high color rendering white light-emitting device having a smooth emission spectrum distribution over the whole range of visible light and different color temperatures and a lighting device containing the same.

BACKGROUND ART

In the case of a blue LED that is a semiconductor light-emitting device, light that is different from blue light inherent in semiconductor, i.e., white light, can be obtained by phosphor coating on the surface of the semiconductor light-emitting device. A general LED lighting device uses a nitride widegap semiconductor based on GaN, and emits blue light centered at 460 nm. This light has a narrow emission half-width, and it is called blue spike. In particular, 450-460 nm blue spike may have a risk of damage to the retina of human eyes and deteriorate the pigments of art works including oil painting, and thus studies have been made to eliminate the blue spike if possible, and there are many such products available on the market. White LED lamps are widely spread as a light source for lighting in galleries and museums with an aim of providing natural light.

A variety of methods for obtaining white light have been devised until now, and a combination of a blue LED chip with yellow phosphor was first put to practical use in the late 1990s, and then a combination of a blue LED chip with green phosphor and red phosphor was put to practical use so as to improve the color rendition. In the early 2000s, high color rendering white LED lighting according to a phosphor excitation method by the mixing of three primary colors of light using light emission of blue phosphor, green phosphor and red phosphor by use of a violet LED chip was developed. This white LED is fundamentally different from blue LED excitation in that excitation light itself does not make up white light. Accordingly, scattering properties of visible light of multiple phosphors are synthesized into white light according to Lambertian scattering, and thus it is close to the light emitting properties of AAA high color rendering fluorescent lamps.

Additionally, available phosphors come in various types and the possibility for light quality improvements is veiled. Accordingly, applications in the lighting field for color evaluation strictly requiring color reproducibility and color fidelity are expected in the future.

Currently, a white LED device excited by a blue LED chip achieves high color rendition, but fundamentally has drawbacks of a lack of 380-450 nm visible light and a non-uniform spectrum distribution with blue spikes in excitation light. Additionally, because excitation light is a component that makes up white light as it is, the prominent high current and high temperature dependence occurs in the optical properties and color temperature changes easily occur. In contrast, a method for generating white light using a violet LED chip is good because only light emission of phosphors makes up white light. Recently, with the development of durable silicone resin as an encapsulant in violet excitation and a variety of high efficiency phosphors as well as efficiency enhancement of a violet LED chip, violet excitation white LEDs attain attention, and possibly they will replace the existing blue excitation white LEDs in the general lighting field requiring high color rendition in the future.

However, the violet excitation white LED devices manufactured so far have a drawback of a non-uniform spectrum distribution due to strong peaks of blue light emission, green light emission and red light emission appearing in the emission spectrum distribution. However, there is a possibility of enhancing and improving the light quality by optimally controlling the emission spectrum of the phosphor. In particular, with the development of the phosphor coating technique that produces white light, it is possible to develop a white LED light source having the better properties than the discharge light source performance of the existing fluorescent lamps and halogen lamps.

On the other hand, recently, in evaluating the light quality property of a phosphor-converted white LED by excitation of a semiconductor LED chip, it has been said that only evaluation of the traditional 15 color index (general color rendering index: Ra and special color rendering index: Ri) is insufficient, and currently, the color fidelity index Rf and the color gamut index Rg as new criteria (TM-30-15) for 99 color evaluation are added to the evaluation items in the U.S.A.

Accordingly, there is a need for an optimal phosphor coating method that can achieve an ultra-high color rendering white LED device with the general color rendering index Ra that is equal to or higher than 98 and less than 100 and the special color rendering index Ri that is equal to or higher than 94 and less than 100 in all color temperature ranges. To meet the need, it is necessary to plot an emission spectrum distribution curve that is suited for a desired objective by systematically controlling the emission spectrum of a white LED device according to an established manufacturing method involving coating of a plurality of phosphor materials. That is, there is a need for a method for manufacturing an optimal ultra-high color rendering white LED light source by controlling the emission spectrum of various phosphors.

DISCLOSURE OF THE INVENTION

Technical Problem

To solve the above-described problem, the present disclosure is directed to providing an ultra-high color rendering white light-emitting device satisfying Ra that is equal to or higher than 98 and less than 100 and having a smooth emission spectrum distribution over the whole range of visible light and different color temperatures by optimally controlling the emission spectrum by a combination of many types of phosphor materials that make up white light, and a lighting device containing the same.

Technical Solution

To solve the above-described problem, the present disclosure provides an ultra-high color rendering white light-emitting device including a semiconductor LED chip that emits a violet wavelength range of light with an emission peak at 380 nm to 430 nm, and a phosphor layer distributed in a transparent resin layer that emits light when excited by an excitation wavelength of the violet LED chip, wherein the phosphor layer includes a first phosphor having an emission peak at 450-470 nm, a second phosphor having an emission peak at 510-550 nm, a third phosphor having an emission peak at 550-590 nm, a fourth phosphor having an emission peak at 630-660 nm, and a fifth phosphor having an emission peak at 660-730 nm, and the ultra-high color rendering white light-emitting device has a general color rendering index Ra that is equal to or higher than 98 and less than 100, a special color rendering index Ri that is equal to or higher than 94 and less than 100 for each of R9 (red) and R12 (blue), and emission efficiency that is equal to or higher than 80 lm/W.

A weight ratio of the first phosphor, the second phosphor, the third phosphor, the fourth phosphor and the fifth phosphor may be 7.3-24.0:1.0:0.4-10:4.6-14.0:0.2-0.6.

In the ultra-high color rendering white light-emitting device, a color temperature Tc based on an intensity ratio of 630 nm red emission intensity R and 455 nm blue emission intensity B in the emission spectrum of each color temperature of 2700K-6500K may satisfy the following (Equation 1):

$$Tc(K)=3700(B/R)+1800 \quad \text{(Equation 1)}$$

The ultra-high color rendering white light-emitting device may have a continuous emission spectrum in a visible wavelength range of 430 nm to 630 nm, and a straight-line or uniform spectrum distribution.

The ultra-high color rendering white light-emitting device may have a continuous emission spectrum in a visible wavelength range of 430 nm to 630 nm in a color temperature range of 4500K or above, a percent of decrease of spectrum of less than 10% with the increasing wavelength, and a general color rendering index Ra of 98-100.

The ultra-high color rendering white light-emitting device may have a continuous emission spectrum in a visible wavelength range of 430 nm to 630 nm in a color temperature range of less than 4500K, a percent of increase of spectrum of less than 50% with the increasing wavelength, and a general color rendering index Ra of 98-100.

The present disclosure also provides a white light-emitting module containing the ultra-high color rendering white light-emitting device.

The white light-emitting module may contain two or more ultra-high color rendering white light-emitting devices having different color temperatures.

ADVANTAGEOUS EFFECTS

The ultra-high color rendering white light-emitting device according to the present disclosure satisfies Ra that is equal to or higher than 98 and less than 100, and has a smooth emission spectrum distribution over the whole range of visible light by optimally controlling the emission spectrum, thereby achieving high quality light emission over a wide range of color temperatures, and accordingly can be used in the lighting field strongly requiring color reproducibility and color fidelity.

MODE FOR CARRYING OUT THE INVENTION

Figure 1:
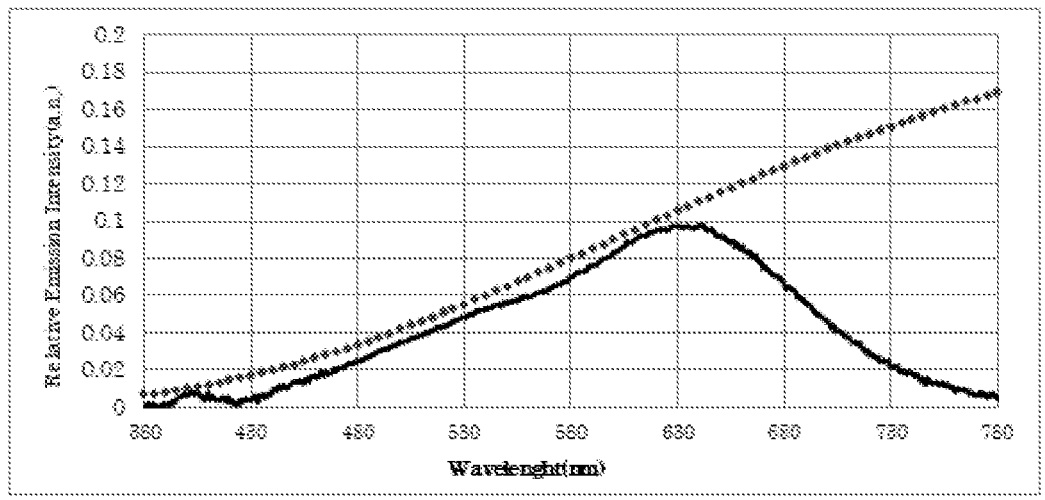
FIG. 1 shows the emission spectrum according to an embodiment of the present disclosure, in which the solid line indicates the spectrum according to an embodiment (2537K) of the present disclosure, and the dash line indicates the emission spectrum of a halogen lamp for art gallery lighting.

Hereinafter, the preferred embodiments of the present disclosure are described in detail. In describing the present disclosure, when it is deemed that a certain detailed description of relevant known technology renders the subject matter of the present disclosure ambiguous, the detailed description is omitted herein. Throughout the specification, it should be understood that when an element is referred to as "including" a component, it does not preclude the presence of other component and may further include other component unless the context clearly indicates otherwise.

Various modifications may be made to the present disclosure and the present disclosure may have many embodiments, and particular embodiments will be illustrated and specifically described in the detailed description. However, this is not intended to limit the present disclosure to particular embodiments, and it should be understood that the present disclosure covers all changes, equivalents or substituents included in the spirit and technical scope of the present disclosure.

The terminology used herein is only for the purpose of describing particular embodiments, but not intended to be limiting of the present disclosure. As used herein, the singular forms are intended to include the plural forms as well, unless the context clearly indicates otherwise. It should be understood that the term "comprises" or "includes" when used in this specification, specifies the presence of stated features, integers, steps, operations, elements, components or their combination, but does not preclude the presence or addition of one or more other features, integers, steps, operations, elements, components or their combination.

The present disclosure relates to an ultra-high color rendering white light-emitting device including a semiconductor LED chip that emits a violet wavelength range of light with an emission peak at 380 nm to 430 nm and a phosphor layer distributed in a transparent resin layer that emits light when excited by an excitation wavelength of the violet LED chip, wherein the phosphor layer includes a first phosphor having an emission peak at 450-470 nm, a second phosphor having an emission peak at 510-550 nm, a third phosphor having an emission peak at 550-590 nm, a fourth phosphor having an emission peak at 630-660 nm, and a fifth phosphor having an emission peak at 660-730 nm.

The semiconductor LED chip preferably uses a GaN-based semiconductor LED chip as an excitation chip of the emission half-width of 30 nm having the center wavelength at 405 nm. In this instance, the semiconductor LED chip may have an emission peak at 380 nm to 430 nm, and external quantum efficiency is preferably 50% or above. When the emission peak is outside the above range, it cannot have the center wavelength at 405 nm and it is difficult to emit white light, and when the quantum efficiency is less than 50%, the emission efficiency reduces. Additionally, the light-emitting LED may additionally include various structures (electrode structure, reflection structure, and inverted flip chip structure) for extracting light emitted from the light emitting layer in a larger amount outside.

The light-emitting device of the present disclosure contains five types of phosphors, and preferably the following phosphors, each of which wavelength is converted to the blue, green, yellow, red and deep red ranges when excited by light emission from the semiconductor LED chip.

The first phosphor is blue phosphor, and preferably blue phosphor that can be excited in the wavelength range of 380-430 nm, and has an emission peak at 450-470 nm, and preferably 460 nm, and has a weight median diameter of 15-20 μm.

The second phosphor is green phosphor, and preferably green phosphor that can be excited in the wavelength range of 380-430 nm, and has an emission peak at 510-550 nm, and preferably 520 nm, and has a weight median diameter of 20-25 μm.

The third phosphor is yellow phosphor, and preferably yellow phosphor that can be excited in the wavelength range of 380-430 nm, and has an emission peak at 550-590 nm, and preferably 580 nm, and a weight median diameter of 15-20 μm.

The fourth phosphor is red phosphor, and preferably red phosphor that can be excited in wavelength range of 380-430 nm, and has an emission peak at 630-660 nm, and preferably 630 nm, and a weight median diameter of 15-20 μm.

The fifth phosphor is deep red phosphor, and preferably deep red phosphor that can be excited in the wavelength range of 380-430 nm, and has an emission peak at 660-730 nm, and preferably 660 nm, and the weight median diameter of 15-20 μm.

Additionally, the amount of phosphors used in the light-emitting device of the present disclosure can be appropriately selected and used to satisfy the light-emitting device of the present disclosure, but a weight ratio the first phosphor, the second phosphor, the third phosphor, the fourth phosphor and the fifth phosphor may be 7.3-24.0:1.0:0.4-10:4.6-14.0:0.2-0.6. When the phosphors are outside the above ratio, it is impossible to obtain sufficient emission properties.

The light emitting unit of the light-emitting device of the present disclosure contains the phosphors and transparent resin as an encapsulant. That is, the encapsulant preferably includes transparent resin having sufficient transmittance and durability of excitation light (peak wavelength 380-430 nm) from the semiconductor LED device, and more preferably silicone resin.

The amount of the phosphors included in the light emitting unit is preferably 4 wt % to 70 wt % of the total weight of the light emitting unit. Here, the weight of the light emitting unit refers to the sum of the total weight of the phosphors included in the light emitting unit, the weight of silicone resin as the encapsulant, and the weight of an additive such as silica powder ($SiO_2$) added as necessary.

The ultra-high color rendering white light-emitting device may have the general color rendering index Ra that is equal to or higher than 98 and less than 100, and the special color rendering index Ri that is equal to or higher than 94 and less than 100 for each of R9 (red) and R12 (blue). When each color rendering index does not achieve the above range, color rendition reduces and desired white may not be produced. Additionally, the emission efficiency of the white light-emitting device may be equal to or higher than 80 lm/W. When the emission efficiency is less than 80 lm/W, the power amount necessary for light emission increases, and due to light emission, heat is generated too much and the product quality reduces.

In the ultra-high color rendering white light-emitting device, the color temperature Tc based on the intensity ratio of 630 nm red emission intensity R and 455 nm blue emission intensity B in the emission spectrum of each color temperature of 2700K-6500K may satisfy the following (Equation 1).

$$Tc(K)=3700(B/R)+1800 \qquad \text{(Equation 1)}$$

Accordingly, the B/R ratio is linear to Tc, and it may be a guideline in determining an appropriate phosphor ratio of the ultra-high color rendering white device by adjusting the emission intensity of Blue and Red, and there may be an effect in reducing the cost and time required to obtain accurate color temperature and optical properties. Additionally, outside the corresponding computation formula, it is determined that it is difficult to implement a violet excitation ultra-high color rendering white LED.

The ultra-high color rendering white light-emitting device may have a continuous emission spectrum in the visible wavelength range of 430 nm to 630 nm, and a straight-line or uniform spectrum distribution. Failure to have a continuous emission spectrum in the visible wavelength range of 430 nm to 630 nm or a straight-line or uniform spectrum distribution does not achieve ultra-high color rendition required by the present disclosure. Additionally, its analysis for each color temperature is as below.

The ultra-high color rendering white light-emitting device may have a continuous emission spectrum in the visible wavelength range of 430 nm to 630 nm in the color temperature range of 4500K or above, and the percent of increase or decrease of spectrum of less than 10% with the increasing wavelength (see FIGS. 3 to 6), and the general color rendering index Ra of 98-100. When the percent of increase or decrease of spectrum with the wavelength exceeds 10%, the general color rendering index reduces down to less than 98 in the color temperature range of 4500K or above, failing to achieve desired ultra-high color rendition.

The ultra-high color rendering white light-emitting device may have a continuous emission spectrum in the visible wavelength range of 430 nm to 630 nm in the color temperature range of less than 4500K, the percent of increase of spectrum of less than 50% with the increasing wavelength (see FIGS. 1 and 2), and the general color rendering index Ra of 98-100. When the percent of increase of spectrum with the wavelength is equal to or higher than 50%, the general color rendering index reduces down to less than 98 in the color temperature range of less than 4500K, failing to achieve desired ultra-high color rendition.

The present disclosure also provides a white light-emitting module containing the ultra-high color rendering white light-emitting device.

The white light-emitting module may contain two or more ultra-high color rendering white light-emitting devices having different color temperatures. In the case of light emission by a combination of two or more ultra-high color rendering white light-emitting devices having different color temperatures as described above, it is possible to manufacture a white LED that can emit white light over a wider range of color temperatures.

Hereinafter, the preferred embodiments of the present disclosure will be described in sufficient detail for those having ordinary skill in the corresponding field to easily practice the present disclosure with reference to the accompanying drawings. Additionally, in describing the present disclosure, when it is deemed that a certain detailed description of relevant known functions or known elements unnecessarily makes the subject matter of the present disclosure ambiguous, its detailed description is omitted herein. Additionally, certain features depicted in the drawings are exaggerated or reduced or simplified for easiness of description, and the drawings and their elements are not necessarily shown in exact scale. However, those skilled in the art will easily understand these details.

EXAMPLE

A white device was manufactured using the following materials as a semiconductor LED chip, phosphor materials and an encapsulant, and evaluation was conducted.

(1) Semiconductor LED Chip

A semiconductor LED chip was used for a light emitting layer of InGaN/GaN multiple quantum well structure having the peak wavelength of 405 nm and the half-width of 30 nm. It is a rectangular shape of 520 μm×390 μm.

(2) Encapsulant

Silicone resin and silica powder ($SiO_2$) as an anti-settling agent were used.

(3) Phosphors

For phosphors, the following phosphor materials were used:

Blue phosphor: $(Sr,Br)_{10}(PO_4)_6Cl_2$:Eu
Green phosphor: SiAlON:EU
Yellow phosphor: $(Ba,Sr)Si_2(O, Cl)_2N_2$:Eu
Red phosphor: $CaAlSi(ON)_2$:Eu
Deep red phosphor: $CaAlSiN_2$:Eu The violet LED having InGaN/GaN multiple quantum well structure was mounted on a LEAD FRAME package having electrode wiring, and encapsulated using a composition containing the phosphors dispersed in the silicone resin according to a blend ratio of each of the five types of phosphors. The mixed phosphor solution was directly coated on the violet LED chip thoroughly using a dispenser.

Experimental example

The emission spectrum measurements were made at room temperature under the condition of 20-65 mA forward current applied. The measurement device used is WITH-LIGHT OPI-100 (Korea).

Table 1 shows the values that give the optimum condition in practicing the present disclosure. The photoluminescence (PL) spectrum of the phosphor mixture was measured by determining the mix ratio of the five types of phosphors in advance before coating the phosphors on the semiconductor LED chip, and the spectrum was designed to suit FIG. 7. The color temperatures (2737K, 3028K. 4477K, 5393K, 6488K) in Tables 1 and 2 are the correlated color temperatures, and each color temperature corresponds to 2700K, 3000K, 44500K, 5400K, 6500K.

TABLE 1

| Color temperature (K) | Chromaticity coordinate value | | Blend ratio (wt %) of phosphors | | | | |
|---|---|---|---|---|---|---|---|
| | x | Y | Blue phosphor | Green phosphor | Yellow phosphor | Red phosphor | Deep red phosphor |
| 2737 | 0.468 | 0.430 | 24.0 | 1.0 | 1.0 | 14.0 | 0.6 |
| 3028 | 0.436 | 0.404 | 7.3 | 1.0 | 0.4 | 4.7 | 0.2 |
| 4477 | 0.362 | 0.368 | 12.3 | 1.0 | 1.0 | 5.0 | 0.3 |
| 5097 | 0.343 | 0.352 | 14.3 | 1.0 | 1.0 | 5.2 | 0.3 |
| 5393 | 0.335 | 0.348 | 13.2 | 1.0 | 1.0 | 4.6 | 0.3 |
| 6488 | 0.313 | 0.329 | 17.2 | 1.0 | 1.0 | 5.6 | 0.2 |

As shown in FIG. 1, the spectrum (solid line) according to the present disclosure shows nearly the same spectrum as the spectrum (red dash line) of a halogen lamp for art gallery lighting in the range of visible light (430-630 nm) at the color temperature of 2700K, and an amount of infrared and ultraviolet light produced significantly reduces, thereby minimizing light damage to art works.

Figure 2:
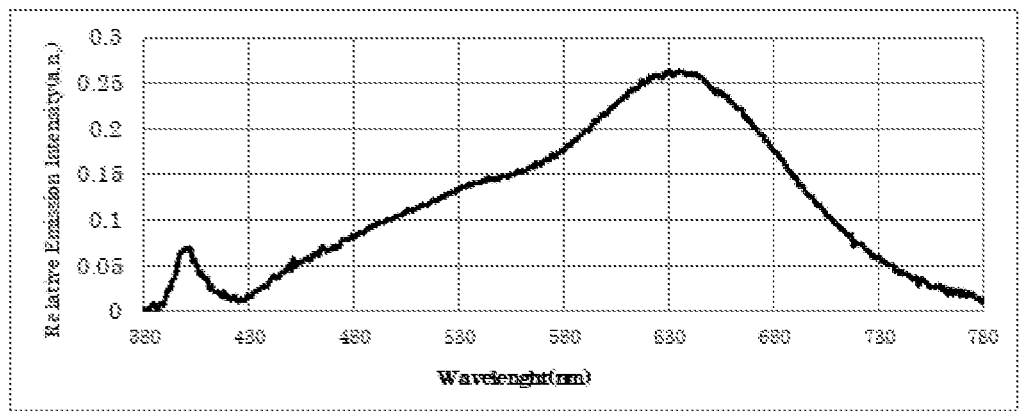
FIG. 2 is a graph showing the spectrum at the color temperature of 3028K as the emission spectrum according to an embodiment of the present disclosure.
Figure 3:
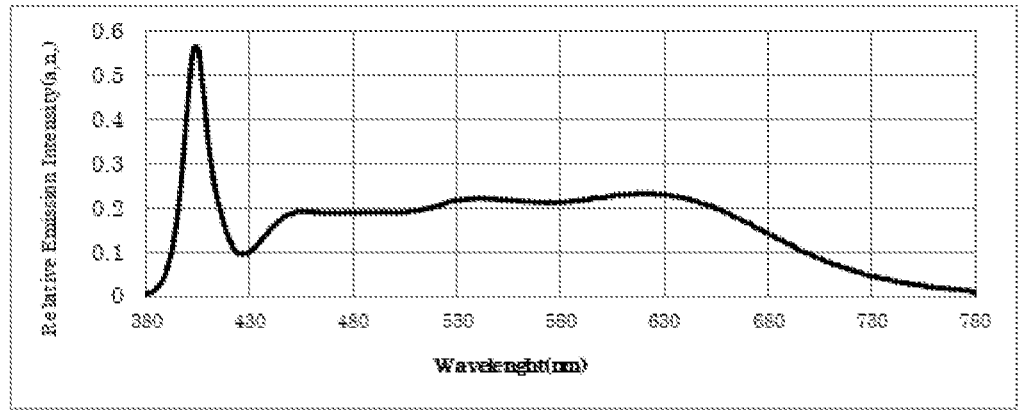
FIG. 3 is a graph showing the spectrum at the color temperature of 4477K as the emission spectrum according to an embodiment of the present disclosure.
Figure 4:
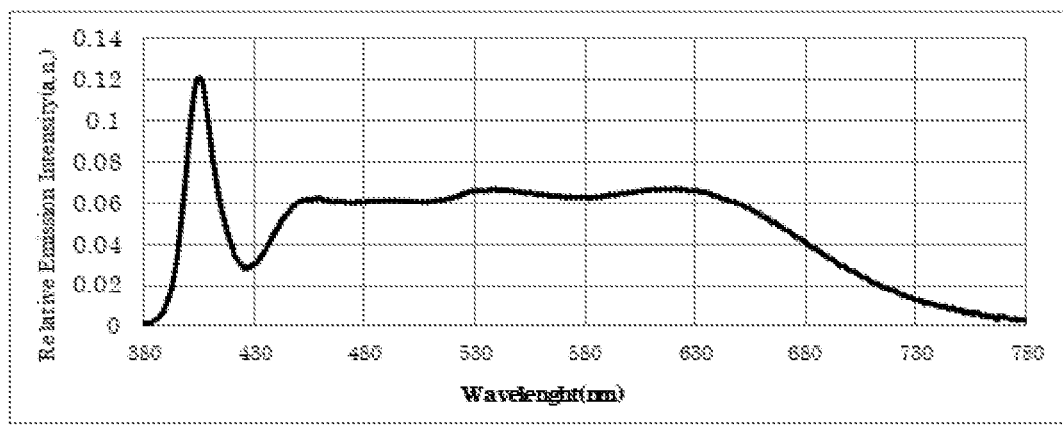
FIG. 4 is a graph showing the spectrum at the color temperature of 5097K as the emission spectrum according to an embodiment of the present disclosure.
Figure 5:
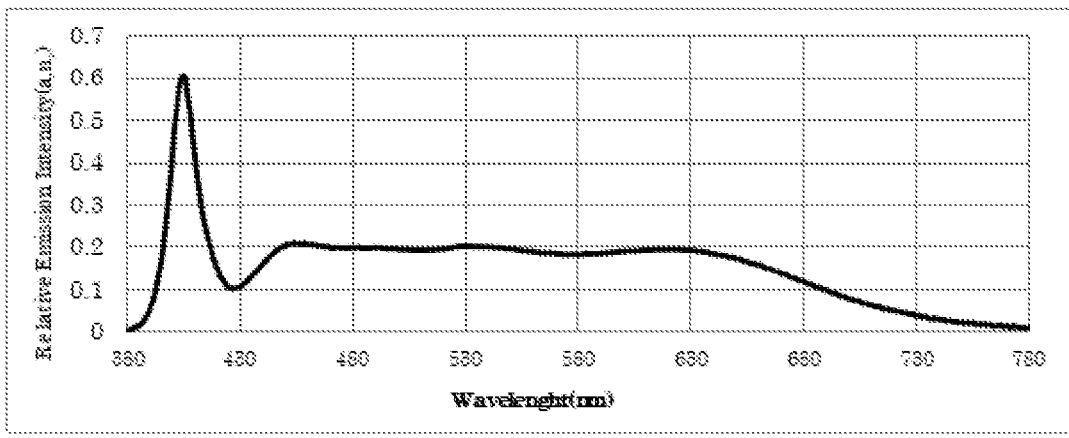
FIG. 5 is a graph showing the spectrum at the color temperature of 5400K as the emission spectrum according to an embodiment of the present disclosure.
Figure 6:
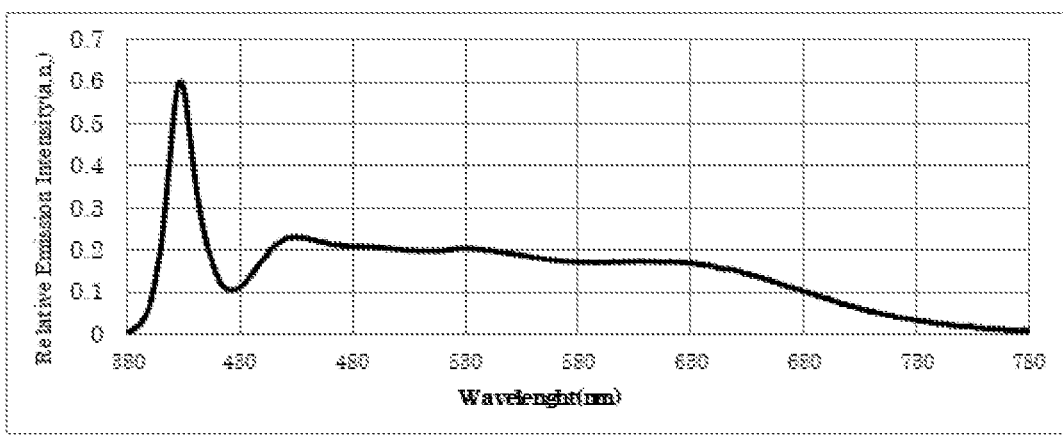
FIG. 6 is a graph showing the spectrum at the color temperature of 6500K as the emission spectrum according to an embodiment of the present disclosure.

Additionally, FIGS. 2 to 6 show the spectrum at the color temperature of 3028K, 4477K, 5097K, 5393K and 6488K respectively. As shown in FIG. 2, it was found that the percent of increase of spectrum is less than 50% with the increasing wavelength at the color temperature of less than 4500K, and the peak of blue light is low. Additionally, as shown in FIGS. 3 to 6, it was found that the percent of increase or decrease of spectrum is less than 10% with the increasing wavelength at the color temperature of 4500K or above.

Figure 7:
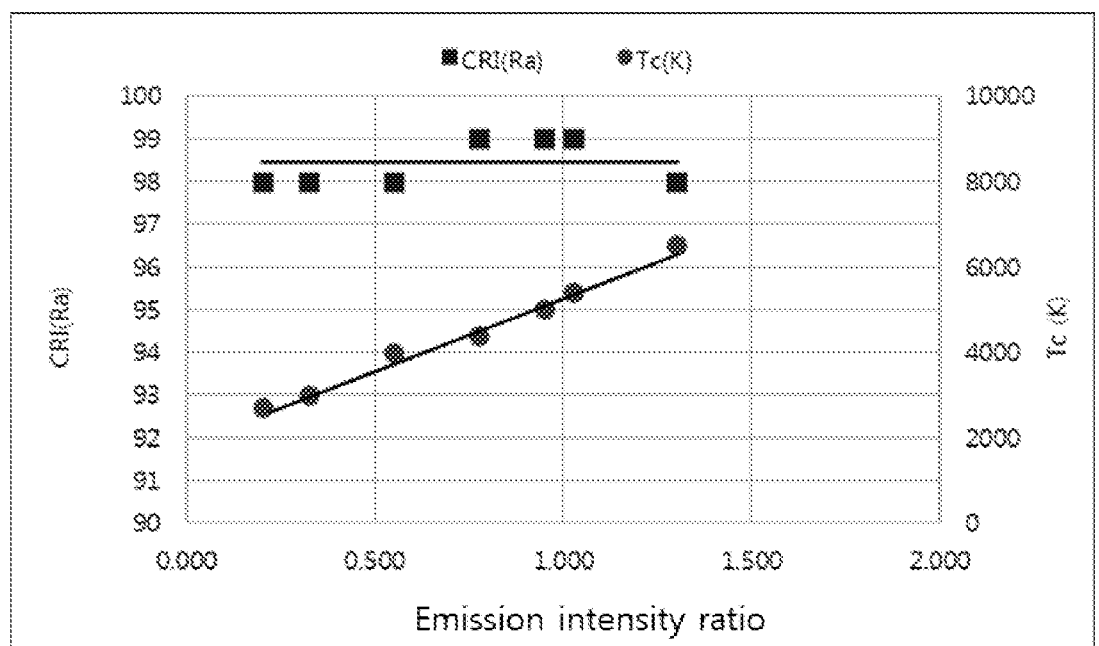
FIG. 7 is a graph showing each of a relationship of the color temperature Tc to an intensity ratio of 455 nm blue emission intensity B and 630 nm red emission intensity R and the general color rendering index Ra according to an embodiment of the present disclosure.

FIG. 7 shows the relationship between the intensity ratio of 455 nm blue emission intensity B/630 nm red emission intensity R and the color temperature. Additionally, the general color rendering index Ra was indicated. The average Ra was 98.5 in the experimented color temperature range. According to FIG. 7, it was found that the white light-emitting device of the present disclosure satisfies the following Equation 1:

$$Tc=3700(B/R)+1800 \quad \text{(Equation 1)}$$

Emission Spectrum Intensity

As shown in FIGS. 1 to 6, as the color temperature increases, the violet light component in 405 nm excitation light is stronger, and the red emission intensity is weaker. Meanwhile, it is important to adjust the proportion of the green phosphor to prevent green light emission from being stronger than red light emission intensity, and to disallow any peak to appear. Additionally, the weight of the blue phosphor was adjusted such that the intensity ratio of 455 nm blue emission intensity and 405 nm violet emission intensity does not exceed 3. As shown in FIG. 7, it can be seen that the intensity ratio of 455 nm blue emission intensity B and 630 nm red light emission intensity R has a proportional relationship with the color temperature Tc. Because this fact is very important to obtain an ultra-high color rendering white LED device, this equation (Tc=3700 (B/R)+1800) is a criterion in setting each phosphor ratio to properly adjust the color temperature.

Emission Spectrum Shape

Describing the shape in the emission spectrum of the white LED having the properties of FIGS. 1 to 6, at the majority of color temperatures, a uniform spectrum shape is seen in the longer wavelength range than about 450 nm. It should be noted that the spectrum is smooth and continuous over the range of 480-500 nm, and there is no need to intentionally add blue-green phosphor.

As the condition for obtaining ultra-high color rendition, it is important that the spectrum is uniform on the whole. First, as described above, FIG. 1 is similar to the spectrum of a halogen lamp, and the emission intensity increases uniformly in a straight line. From 3028K to 5097K, small fluctuations that look like peaks of blue, green and red appear, but when it reaches 5393K, such peaks are hardly seen.

Figure 8:
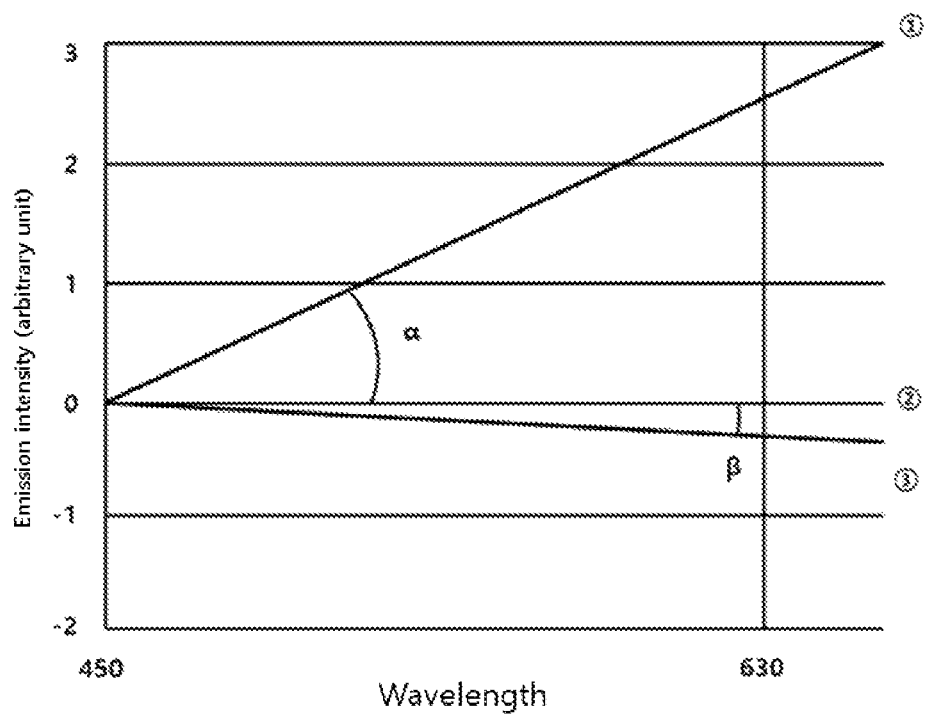
FIG. 8 shows the spectrum according to an embodiment of the present disclosure, and is a graph of approximately uniform spectrum at 430 nm to 630 nm.

Accordingly, in designing the spectrum shape exhibiting ultra-high color rendition, it is desirable to disallow any peak of each phosphor to appear. That is, the emission spectrum shape is approximately smooth over the wavelength of 430 nm to 630 nm FIG. 8 provides the guidelines for designing an ultra-high color rendering white light-emitting device based on the above results. That is, a nearly uniform spectrum shape is seen at 4500K-5500K, and the intensity increases linearly with a rightward increasing slope at the color temperature equal to or lower than 4500K-5500K. This inclination angle a is +26° (0<α<+26°) the percent of increase of less than about 50%). In contrast, the inclination angle β has tendency to slightly go down to the right side at the color temperature higher than 4500K-5500K. This angle is −3° (−3°<62 <0) (the percent of change of less than 10%). This diagram shows each of ①approximation properties of spectrum shape at the color temperature lower than 4500K-5500K, ② approximation properties of spectrum shape at the color temperature of 4500K-5500K, and ③ approximation properties of spectrum shape at the color temperature higher than 4500K-5500K.

Emission Efficiency

Because fives types of phosphors were mixed as in the above embodiment, despite that a light emission excitation energy loss is predicted due to cascade excitation, the maximum of 110 lm/W could be obtained when the emission efficiency is 65 mA. This is because it is possible to design the optimal ratio and the optimal phosphor combination based on the correlation between the plurality of phosphors through many experiments.

The color rendition was actually measured using a WITHLIGHT OPI-100 measuring device (Korea). Additionally, the color fidelity index Rf and the color gamut index Rg were actually measured using an ASENSETEK LP Pro device (Taiwan).

The following Table 2 shows Ra, R9, R11, R12, R15, Rf and Rg values for each color temperature.

TABLE 2

| CCT(K) | Ra | R9 | R11 | R12 | R15 | Rf | Rg |
|---|---|---|---|---|---|---|---|
| 2737 | 98 | 95 | 95 | 99 | 98 | | |
| 3028 | 98 | 91 | 96 | 96 | 99 | 96 | 100 |
| 4477 | 99 | 94 | 100 | 98 | 100 | | |
| 5097 | 99 | 98 | 97 | 97 | 98 | 97 | 100 |
| 5393 | 99 | 96 | 98 | 97 | 99 | | |
| 6488 | 98 | 98 | 98 | 98 | 98 | 98 | 100 |

Table 3 shows Ra (1 to 8) and Ri (9 to 15) values at 2737K.

TABLE 3

| Ra | R1 | R2 | R3 | R4 | R5 | R6 | R7 | R8 |
|---|---|---|---|---|---|---|---|---|
| 98.0 | 99 | 99 | 98 | 97 | 98 | 98 | 97 | 98 |
| | R9 | R10 | R11 | R12 | R13 | R14 | R15 | |
| | 95 | 99 | 95 | 99 | 98 | 98 | 98 | |

Table 4 shows Ra (1 to 8) and Ri (9 to 15) values at 3028K.

TABLE 4

| Ra | R1 | R2 | R3 | R4 | R5 | R6 | R7 | R8 |
|---|---|---|---|---|---|---|---|---|
| 98.3 | 98.8 | 99.0 | 98.8 | 98.2 | 98.6 | 96.8 | 97.6 | 95.6 |
| | R9 | R10 | R11 | R12 | R13 | R14 | R15 | |
| | 91.3 | 99.2 | 96.3 | 95.5 | 98.6 | 98.4 | 98.6 | |

Table 5 shows Ra (1 to 8) and Ri (9 to 15) values at 4477K.

TABLE 5

| Ra | R1 | R4 | R7 | R8 |
|---|---|---|---|---|
| 99.3 | 100 | 100 | 99 | 98 |
| | R9 | R12 | R15 | |
| | 94 | 98 | 100 | |

Table 6 shows Ra (1 to 8) and Ri (9 to 15) values at 5097K.

TABLE 6

| R1 | R2 | R3 | R5 | R6 | R7 | R9 |
|---|---|---|---|---|---|---|
| 98 | 99 | 99 | 98 | 98 | 99 | 98 |
| R10 | R11 | R12 | R13 | R14 | R15 | |
| 99 | 97 | 97 | 98 | 99 | 98 | |

Table 7 shows Ra (1 to 8) and Ri (9 to 15) values at 5393K.

TABLE 7

| Ra   | R1 | R2 | R4  | R6  | R7  | R8  |
|------|----|----|-----|-----|-----|-----|
| 99.1 | 99 | 99 | 98  | 98  | 99  | 99  |
|      | R9 | R10| R12 | R14 | R15 |     |
|      | 96 | 99 | 97  | 99  | 99  |     |

Table 8 shows Ra (1 to 8) and Ri (9 to 15) values at 6488K.

TABLE 8

| Ra   | R1 | R2  | R4  | R7  | R8 |
|------|----|-----|-----|-----|-----|
| 98.3 | 98 | 99  | 98  | 99  | 98 |
|      | R9 | R10 | R12 | R15 |    |
|      | 98 | 98  | 98  | 98  |    |

As previously described, by optimally combining five types of phosphors at a weight ratio as indicated in Table 1 and adjusting an appropriate amount of each of the blue phosphor and the deep red phosphor, the very high Ra and Ri values could be achieved in all color temperatures as shown in Tables 3 to 8. In particular, at 4477K, except R9=94, the other numerical values are significantly high numerical values that have never been reported.

The color fidelity index Rf and the color gamut index Rg of the ultra-high color rendering white light-emitting device were measured, and these numerical values were studied. Rf denotes the average fidelity of light of 99 color samples, and its maximum is 100. Rg denotes the average color gamut, and is 100 when it is equal to the color gamut of reference light.

The color fidelity index Rf and the color gamut index Rg at 3028K, 5097K and 6488K show the results of Table 2.

Rf that denotes a similarity of color illuminated by the white LED light source of the present disclosure and a reference light source is each 96, 97 and 98. As Ra increases, Rf increases, and it is found that they have a proportional relationship.

The color gamut index Rg at 3028K, 5097K and 6488K is all 100, which indicates a complete match to the reference light source. The color gamut index denotes a saturation change of color illuminated by the white LED light source of the present disclosure. 100 indicates a complete match of saturation. The color gamut index above 100 indicates that saturation is high and color is over-saturated in red. In particular, the color gamut is related to visual hue, but theoretically, as the color gamut is closer to 100, the light quality is better.

In particular, the present disclosure implements an excellent ultra-high color rendering white LED lighting device with Ra close to 99, Rf higher than 96 and Rg of 100 in all color temperature ranges by adjusting the content of the first phosphor, the blue phosphor, and adding an appropriate amount of the fifth phosphor, the deep red phosphor.

The white LED light-emitting device having the above properties is an ultra-high color rendering white LED that satisfies all conditions mentioned in the appended claims. In particular, the ultra-high color rendering white LED device and the lighting device of the present disclosure with high chroma properties having all high Ri values is beneficial in color evaluation requiring high precision and the medical lighting field. It is possible to design an ultra-high color rendering white LED light source having color temperatures of more various chromaticity coordinates (x, y) by a combination of white LED devices having each color temperature made by the present disclosure.

The particular embodiments of the present disclosure have been hereinabove described in detail, but this detailed description is just a preferred embodiment to those having ordinary skill in the art, and it will be obvious that the scope of the present disclosure is not limited thereby. Accordingly, the substantial scope of the present disclosure shall be defined by the appended claims and equivalents thereto.

The invention claimed is:

1. An ultra-high color rendering white light-emitting device comprising:
   a semiconductor LED chip emitting a violet wavelength range of light with an emission peak at 380 nm to 430 nm; and
   a phosphor layer distributed in a transparent resin layer emitting light when excited by an excitation wavelength of the violet LED chip,
   wherein the phosphor layer includes:
      a first phosphor having an emission peak at 450-470 nm, the first phosphor being $(Sr,Br)_{10}(PO_4)_6Cl_2:Eu$;
      a second phosphor having an emission peak at 510-550 nm, the second phosphor being SiAlON:EU;
      a third phosphor having an emission peak at 550-590 nm, the third phosphor being $(Ba,Sr)Si_2(O,Cl)_2N_2:Eu$;
      a fourth phosphor having an emission peak at 630-660 nm, the fourth phosphor being $CaAlSi(ON)_2:Eu$; and
      a fifth phosphor having an emission peak at 660-730 nm, the fifth phosphor being $CaAlSiN_2:Eu$,
   wherein a weight ratio of the first phosphor, the second phosphor, the third phosphor, the fourth phosphor and the fifth phosphor is 12.3 : 1.0 : 1.0 : 5.0 : 0.3, and
   wherein the correlated color temperature is 4477K and the ultra-high color rendering white light-emitting device has a general color rendering index Ra that is 99, a special color rendering index Ri that is 94 and for R9 (red) and 98 for R12 (blue), and emission efficiency that is equal to or higher than 80 lm/W.

2. The ultra-high color rendering white light-emitting device of claim 1, wherein in the emission spectrum of each correlated color temperature of 2700K to 6500K, the correlated color temperature has a proportional relationship with the intensity ratio of the red emission intensity (R) of 630 nm and the blue emission intensity (B) of 455 nm.

3. The ultra-high color rendering white light-emitting device of claim 1, wherein in the ultra-high color rendering white light-emitting device, a color temperature Tc based on an intensity ratio of 630 nm red emission intensity R and 455 nm blue emission intensity B in an emission spectrum of each color temperature of 2700K-6500K satisfies the following (Equation 1):

$$Tc(K)=3700(B/R)+1800. \quad \text{(Equation 1)}$$

4. The ultra-high color rendering white light-emitting device of claim 1, wherein the ultra-high color rendering white light-emitting device has a continuous emission spectrum in a visible wavelength range of 430 nm to 630 nm, and a straight-line or uniform spectrum distribution.

5. The ultra-high color rendering white light-emitting device of claim 1, wherein the ultra-high color rendering white light-emitting device has a continuous emission spectrum in a visible wavelength range of 430 nm to 630 nm in a color temperature range 4500K or above, a percent of decrease of spectrum of less than 10% with the increasing wavelength, and a general color rendering index Ra of 98-100.

6. The ultra-high color rendering white light-emitting device of claim 1, wherein the ultra-high color rendering white light-emitting device has a continuous emission spectrum in a visible wavelength range of 430 nm to 630nm in a color temperature range of less than 4500K, a percent of increase of spectrum of less than 50% with the increasing wavelength, and a general color rendering index Ra of 98-100.

7. A white light-emitting module containing an ultra-high color rendering white light-emitting device comprising:
    a semiconductor LED chip emitting a violet wavelength range of light with an emission peak at 380 nm to 430 nm; and
    a phosphor layer distributed in a transparent resin layer emitting light when excited by an excitation wavelength of the violet LED chip,
    wherein the phosphor layer includes:
        a first phosphor having an emission peak at 450-470 nm, the first phosphor being $(Sr,Br)_{10}(PO_4)_6Cl_2$:Eu;
        a second phosphor having an emission peak at 510-550 nm, the second phosphor being SiAlON:EU;
        a third phosphor having an emission peak at 550-590 nm, the third phosphor being $(Ba,Sr)Si_2(O,Cl)_2N_2$:Eu;
        a fourth phosphor having an emission peak at 630-660 nm, the fourth phosphor being $CaAlSi(ON)_2$:Eu; and
        a fifth phosphor having an emission peak at 660-730 nm, the fifth phosphor being $CaAlSiN_2$:Eu,
    wherein a weight ratio of the first phosphor, the second phosphor, the third phosphor, the fourth phosphor and the fifth phosphor is 12.3 : 1.0 : 1.0 : 5.0 : 0.3, and
wherein the correlated color temperature is 4477K and the ultra-high color rendering white light-emitting device has a general color rendering index Ra that is 99, a special color rendering index Ri that is 94 for R9 (red) and 98 for R12 (blue), and emission efficiency that is equal to or higher than 80 lm/W.

8. The white light-emitting module of claim 7, wherein the white light-emitting module contains two or more ultra-high color rendering white light-emitting devices having different color temperatures.

\* \* \* \* \*